(12) United States Patent
Hattori et al.

(10) Patent No.: US 6,465,316 B2
(45) Date of Patent: Oct. 15, 2002

(54) SOI SUBSTRATE AND SEMICONDUCTOR DEVICE

(75) Inventors: Nobuyoshi Hattori, Tokyo (JP); Satoshi Yamakawa, Tokyo (JP); Junji Nakanishi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/975,977

(22) Filed: Oct. 15, 2001

(65) Prior Publication Data

US 2002/0019105 A1 Feb. 14, 2002

Related U.S. Application Data

(62) Division of application No. 09/619,579, filed on Jul. 19, 2000.

(30) Foreign Application Priority Data

Jul. 19, 1999 (JP) ............................................. 11-204742

(51) Int. Cl.[7] .................... H01L 21/331; H01L 21/8222
(52) U.S. Cl. ....................................... 438/311; 438/933
(58) Field of Search .................................. 438/311, 312, 438/313, 502, 509, 695, 734, 745, 753, 933, 197, 202, 204

(56) References Cited

U.S. PATENT DOCUMENTS 5,216,271 A * 6/1993 Takagi et al. ................. 29/163

\* cited by examiner

*Primary Examiner*—David Nelms
*Assistant Examiner*—David Nhu
(74) *Attorney, Agent, or Firm*—Oblon, Spivak, McClelland, Maier & Neustadt, P.C.

(57) ABSTRACT

First, a silicon germanium single-crystalline layer and a silicon single-crystalline layer are formed on a main surface of a bond wafer by epitaxy. The overall surface of the bond wafer is oxidized for forming a silicon oxide layer. Then, a base wafer is bonded to the bond wafer. The bond wafer and the base wafer bonded to each other are heated for reinforcing adhesion therebetween. Then, the bond wafer is removed by plasma etching with chlorine gas while making the silicon germanium single-crystalline layer serve as a stopper. Thereafter the silicon germanium single-crystalline layer is polished by chemical mechanical polishing to have a thickness suitable for forming a device. Thus implemented is a method of manufacturing an SOI substrate by bonding capable of employing a layer having a crystal state with small irregularity for serving as a stopper having selectivity for single-crystalline silicon and effectively using the stopper as a device forming layer.

10 Claims, 14 Drawing Sheets

SOI SUBSTRATE AND SEMICONDUCTOR DEVICE

BACKGROUND OF THE INVENTION

1. Field of the Invention

The present invention relates to a method of manufacturing a silicon substrate (referred to as an SOI (silicon on insulator) substrate throughout the specification) comprising a buried silicon oxide layer immediately under a silicon thin film serving as an active layer.

2. Description of the Background Art

When forming a device on the SOI substrate having the buried silicon oxide layer therein as described above, it is possible to reliably isolate the device with respect to the substrate. Therefore, a leakage current between elements is reduced and a device having excellent drivability (driving current, response speed etc.) can be formed. Further, an element isolation region such as a trench may not be deeply formed and can be inhibited from transverse spreading, to attain further refinement. Hence, the SOI substrate is applied to a high-frequency device used in the GHz band, a high-speed microprocessor or a low power consumption element, for example.

Such an SOI substrate can be manufactured by various methods such as an SOS (silicon on sapphire) method or an SIMOX (separation by implanted oxygen) method. Attention is now drawn to a bonding method for manufacturing an SOI substrate by bonding a bond wafer having a buried silicon oxide layer part and a base wafer serving, as a support substrate to each other.

A conventional method of manufacturing an SOI substrate employing the bonding method is described with reference to FIG. 26. First, a bond wafer 1 consisting of a single crystal of silicon is dipped in an ionization solution. An electric field is applied between the bond wafer 1 and the ionization solution for ionizing silicon atoms present on the main surfaces of the bond wafer 1 and dissolving the same in the ionization solution (performing the so-called anodization). At this time, dissolution heterogeneously progresses on one of the main surfaces of the bond wafer 1 and a porous silicon layer (a silicon layer having numerous small grooves or depressions distributed in the crystal) 15 is formed on this main surface.

Then, a silicon single-crystalline layer 4 is formed on a surface of the porous silicon layer 15 by epitaxy. The overall surface of the bond wafer 1 is oxidized for forming a silicon oxide layer 5. Then, a base wafer 2 consisting of a single crystal of silicon is bonded to the main surface of the bond wafer 1 formed with the porous silicon layer 15. The bond wafer 1 and the base wafer 2 bonded to each other are heated to a temperature of at least 900° C., for example, for reinforcing the degree of adhesion therebetween.

The bond wafer 1 is removed by polishing the main surface opposite from that formed with the porous silicon layer 15 serving as a stopper, and thereafter the porous silicon layer 15 is removed by dipping the base wafer 2, which is in close contact with the multilayer structure of the porous silicon layer 15, the silicon single-crystalline layer 4 and the silicon oxide layer 5, in a mixed solution of a hydrofluoric acid solution and aqueous hydrogen peroxide.

Thus, an SOI substrate having the silicon oxide layer 5 as a buried silicon oxide layer is obtained.

As hereinabove described, the porous silicon layer 15 is employed as a stopper when removing the bond wafer 1 in the conventional bonding method. This is because the porous silicon layer 15 has selectivity for single-crystalline silicon in polishing due to the coarse crystal state thereof.

However, the crystal state of the porous silicon layer 15 is disadvantageously irregular. When formed on the surface of the porous silicon layer 15, therefore, the silicon single-crystalline layer 4 readily causes crystal defects. Such crystal defects in the silicon single-crystalline layer 4 may influence the crystal state of the silicon oxide layer 5 formed subsequently to the silicon single-crystalline layer 4, to generate a leakage current between the elements again.

Further, the porous silicon layer 15 merely serving as a stopper must be removed after the bonding step. The porous silicon layer 15 cannot be employed as a layer (hereinafter referred to as a device forming layer) for forming the device on the surface of the SOI substrate due to the inferior crystal state thereof. However, this is inefficient in consideration of effective use of the raw material.

SUMMARY OF THE INVENTION

According to a first aspect of the present invention, a method of manufacturing an SOI substrate comprises steps (a) to (f) of (a) forming a silicon germanium single-crystalline layer on a main surface of a bond wafer consisting of a single crystal of silicon, (b) forming a silicon single-crystalline layer on a surface of the silicon germanium single-crystalline layer, (c) oxidizing a surface of the silicon single-crystalline layer, (d) bonding a base wafer consisting of a single crystal of silicon to the oxidized surface of the silicon single-crystalline layer, (e) heating the bond wafer and the base wafer for reinforcing the degree of adhesion therebetween, and (f) removing the bond wafer.

In the method of manufacturing an SOI substrate according to the first aspect, the silicon germanium single-crystalline layer exhibiting small irregularity in its crystal state and having selectivity for the single crystal of silicon forming the bond wafer hardly causes crystal defects in the silicon single-crystalline layer and reliably enables removal of the bond wafer. Further, the silicon germanium single-crystalline layer can be employed as a device forming layer on the SOI substrate.

According to a second aspect of the present invention, the method of manufacturing an SOI substrate according to the first aspect further comprises a step (g) of reducing the thickness of the silicon germanium single-crystalline layer to a prescribed value subsequently to the step (f).

In the method of manufacturing an SOI substrate according to the second aspect, the thickness of the silicon germanium single-crystalline layer can be set to a level suitable for serving as a device forming layer. Alternatively, the silicon germanium single-crystalline layer can be completely removed for manufacturing a general SOI substrate comprising only a buried silicon oxide layer and a silicon layer on the base wafer.

According to a third aspect of the present invention, a part of the bond wafer in contact with the silicon germanium single-crystalline layer is removed by chemical mechanical polishing or wet etching in the step (f), and the silicon germanium single-crystalline layer is removed by wet etching in the step (g).

In the method of manufacturing an SOI substrate according to the third aspect, not plasma etching but chemical mechanical polishing or wet etching is employed for finishing removal of the bond wafer, whereby the silicon germanium single-crystalline layer has a small possibility of causing crystal defects. Further, the silicon germanium single-crystalline layer is removed by wet etching, whereby the silicon germanium single-crystalline layer and the silicon single-crystalline layer have a small possibility of causing crystal defects.

According to a fourth aspect of the present invention, the method of manufacturing an SOI substrate according to the first aspect further comprises steps (h), (k) and (i) of (h) forming a mask layer on the silicon-germanium single-crystalline layer after the step (f), (k) patterning the mask layer through photolithography, and (i) removing a part of the silicongermanium single-crystalline layer not covered with the mask layer by employing the patterned mask layer as a mask.

In the method of manufacturing an SOI substrate according to the fourth aspect of the present invention, the silicon germanium single-crystalline layer can be subjected to arbitrary patterning for serving as a device forming layer.

According to a fifth aspect of the present invention, the method of manufacturing an SOI substrate according to the fourth aspect further comprises a step O) of oxidizing the part of the silicon-germanium single-crystalline layer not covered with the mask layer after the step (k) in advance of the step (i) for removing the oxidized part of the silicon-germanium single-crystalline layer by wet etching in the step (i).

In the method of manufacturing an SOI substrate according to the fifth aspect, the oxidized part of the silicon germanium single-crystalline layer is removed not by plasma etching but by wet etching when the silicon germanium single-crystalline layer is subjected to arbitrary patterning for serving as a device forming layer, whereby the silicon germanium single-crystalline layer and the silicon single-crystalline layer have a small possibility of causing crystal defects.

According to a sixth aspect of the present invention, the mask layer has a multilayer structure obtained by forming a silicon nitride film on the upper surface of a silicon oxide film, and a photoresist film is formed on a surface of the multilayer structure and the photoresist film is patterned through photolithography for patterning the mask layer by removing a part of the multilayer structure not covered with the photoresist film by employing the photoresist film as a mask in the step (k).

In the method of manufacturing an SOI substrate according to the sixth aspect, the silicon nitride film serves as an anti-oxidation film in a later eleventh step, while the silicon oxide film prevents nitrogen contained in the silicon nitride film from permeating into the surface of the wafer.

According to a seventh aspect of the present invention, the silicon germanium single-crystalline layer is employed as a device forming layer.

In the method of manufacturing an SOI substrate according to the seventh aspect, the crystal state of the silicon germanium single-crystalline layer is so excellent that a device having excellent break-down voltage can be manufactured. Further, mobility of holes in the silicon germanium single-crystalline layer is higher than that in silicon and hence the operating speed of the device can be increased.

According to an eighth aspect of the present invention, the device forming layer is employed as a channel and a source/drain region of a MOSFET.

In the method of manufacturing an SOI substrate according to the eighth aspect, the crystal state of the silicon germanium single-crystalline layer is so excellent that a MOSFET having excellent break-down voltage can be manufactured. Further, mobility of holes is higher than that in silicon and hence the operating speed of a P-channel MOSFET can be increased.

According to a ninth aspect of the present invention, a part of the silicon single-crystalline layer exposed by removal of the silicon germanium single-crystalline layer is employed as a channel and a source/drain region as to an N-channel MOSFET included in the MOSFET.

In the method of manufacturing an SOI substrate according to the ninth aspect, the silicon single-crystalline layer is employed as the channel, whereby the operating speed of the N-channel MOSFET is higher than that in the case of employing the silicon germanium single-crystalline layer as the channel.

According to a tenth aspect of the present invention, the device forming layer is an infrared detection part of an infrared detector.

In the method of manufacturing an SOI substrate according to the tenth aspect, the crystal state of the silicon germanium single-crystalline layer is so excellent that an infrared detector having excellent detection sensitivity can be manufactured.

According to an eleventh aspect of the present invention, another silicon single-crystalline layer is further formed on the upper surface of the silicon germanium single-crystalline layer, the device forming layer is a base layer of a heterojunction bipolar transistor, and one of the silicon single-crystalline layer formed on the upper surface of the silicon germanium single-crystalline layer and the silicon single-crystalline layer present on the lower surface of the silicon germanium single-crystalline layer is a collector layer of the heterojunction bipolar transistor, and the other is an emitter layer of the heterojunction bipolar transistor.

In the method of manufacturing an SOI substrate according to the eleventh aspect, the crystal state of the silicon germanium single-crystalline layer is so excellent that a heterojunction having a small number of interfacial states can be formed. Further, the crystal state of the silicon germanium single-crystalline layer is so excellent that a heterojunction bipolar transistor having excellent breakdown voltage can be manufactured. In addition, mobility of holes in the silicon germanium single-crystalline layer is higher than that in silicon, and hence the operating speed of a PNP heterojunction bipolar transistor can be increased.

According to a twelfth aspect of the present invention, a method of manufacturing an SOI substrate comprises steps (a) to (c) of (a) forming a mask layer on a surface of an SOI substrate comprising a base wafer consisting of a single crystal of silicon, a silicon oxide film formed on a surface of the base wafer, a silicon single-crystalline layer formed on a surface of the silicon oxide film and a silicon germanium single-crystalline layer formed on a surface of the silicon single-crystalline layer, (b) patterning the mask layer through photolithography, and (c) removing a part of the silicon germanium single-crystalline layer not covered with the mask layer by employing the patterned mask layer as a mask.

In the method of manufacturing an SOI substrate according to the twelfth aspect, an effect similar to that in the method of manufacturing an SOI substrate according to the fourth aspect can be attained.

According to a thirteenth aspect of the present invention, the method of manufacturing an SOI substrate according to the twelfth aspect further comprises a step (d) of oxidizing the part of the silicon germanium single-crystalline layer not covered with the mask layer after the step (b) in advance of the step (c) for removing the oxidized part of the silicon germanium single-crystalline layer by wet etching in the step (c).

In the method of manufacturing an SOI substrate according to the thirteenth aspect, an effect similar to that in the method of manufacturing an SOI substrate according to the fifth aspect can be attained.

According to a fourteenth aspect of the present invention, the mask layer has a multilayer structure obtained by forming a silicon nitride film on the upper surface of a silicon oxide film, a photoresist film is formed on a surface of the multilayer structure, and the photoresist film is patterned through photolithography for patterning the mask layer by removing a part of the multilayer structure not covered with the photoresist film by employing the photoresist film as a mask in the step (b).

In the method of manufacturing an SOI substrate according to the fourteenth aspect, an effect similar to that in the method of manufacturing an SOI substrate according to the sixth aspect can be attained.

According to a fifteenth aspect of the present invention, the silicon germanium single-crystalline layer is employed as a device forming layer.

In the method of manufacturing an SOI substrate according to the fifteenth aspect, the crystal state of the silicon germanium single-crystalline layer is so excellent that a device having excellent break-down voltage can be manufactured. Further, mobility of holes in the silicon germanium single-crystalline layer is higher than that in silicon and hence the operating speed of the device can be improved.

According to a sixteenth aspect of the present invention, the device forming layer is employed as a channel and a source/drain region of a MOSFET.

In the method of manufacturing an SOI substrate according to the sixteenth aspect, the crystal state of the silicon germanium single-crystalline layer is so excellent that a MOSFET having excellent break-down voltage can be manufactured. Further, mobility of holes is higher than that in silicon and hence the operating speed of a P-channel MOSFET can be increased.

According to a seventeenth aspect of the present invention, a part of the silicon single-crystalline layer exposed by removal of the silicon germanium single-crystalline layer is employed as a channel and a source/drain region as to an N-channel MOSFET included in the MOSFET.

In the method of manufacturing an SOI substrate according to the seventeenth aspect, the silicon single-crystalline layer is employed as the channel, whereby the operating speed of the N-channel MOSFET is higher than that in the case of employing the silicon germanium single-crystalline layer as the channel.

According to an eighteenth aspect of the present invention, the device forming layer is an infrared detection part of an infrared detector.

In the method of manufacturing an SOI substrate according to the eighteenth aspect, the crystal state of the silicon germanium single-crystalline layer is so excellent that an infrared detector having excellent detection sensitivity can be manufactured.

According to a nineteenth aspect of the present invention, another silicon single-crystalline layer is further formed on the upper surface of the silicon germanium single-crystalline layer, the device forming layer is a base layer of a heterojunction bipolar transistor, and one of the silicon single-crystalline layer formed on the upper surface of the silicon germanium single-crystalline layer and the silicon single-crystalline layer present on the lower surface of the silicon germanium single-crystalline layer is a collector layer of the heterojunction bipolar transistor, and the other is an emitter layer of the heterojunction bipolar transistor.

In the method of manufacturing an SOI substrate according to the nineteenth aspect, the crystal state of the silicon germanium single-crystalline layer is so excellent that a heterojunction having a small number of interfacial states can be formed. Further, the crystal state of the silicon germanium single-crystalline layer is so excellent that a heterojunction bipolar transistor having excellent break-down voltage can be manufactured. In addition, mobility of holes in the silicon germanium single-crystalline layer is higher than that in silicon and hence the operating speed of a PNP heterojunction bipolar transistor can be increased.

An object of the present invention is to implement a method of manufacturing an SOI substrate by bonding, which can employ a layer exhibiting small irregularity in its crystal state as a stopper having selectivity for single-crystalline silicon and effectively utilize the stopper as a device forming layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1.

An embodiment 1 of the present invention relates to a method of manufacturing an SOI substrate by bonding, employing a silicon germanium single-crystalline layer as a stopper.

Figure 1:
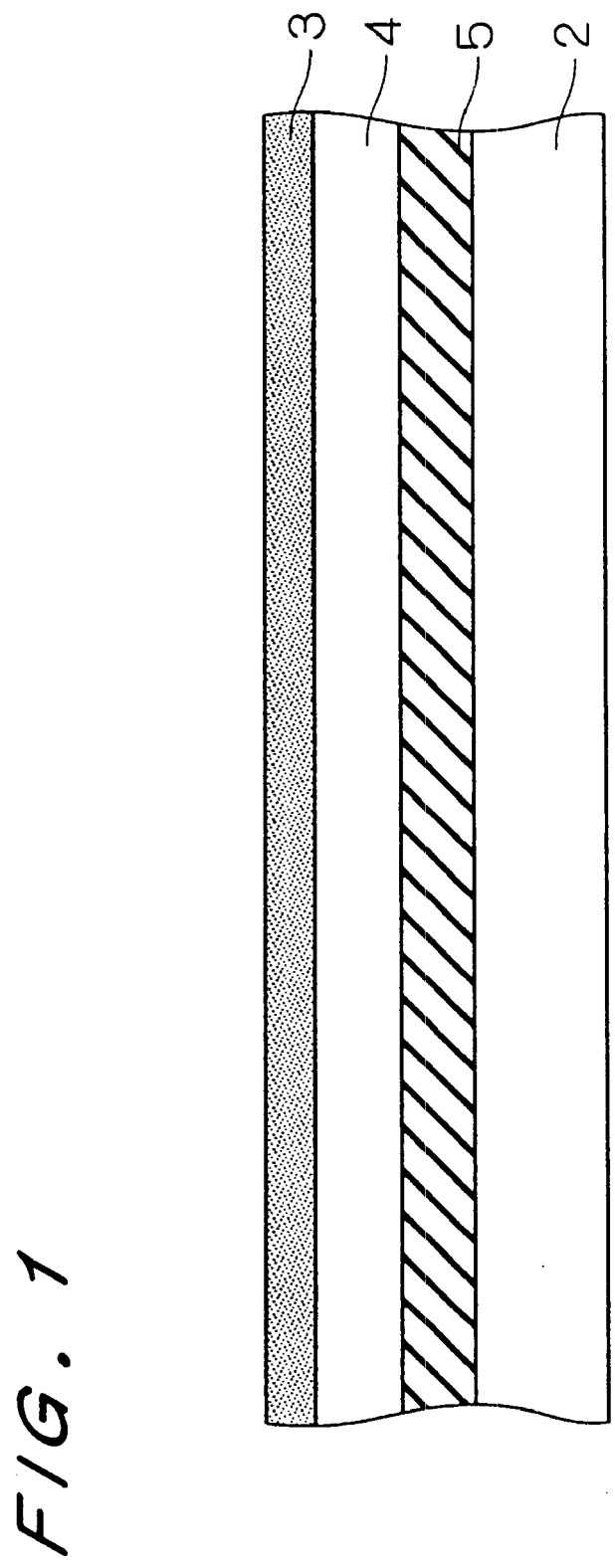
FIG. 1 is a sectional view showing an SOI substrate manufactured by a method of manufacturing an SOI substrate according to an embodiment 1 of the present invention.

FIG. 1 shows an SOI substrate manufactured by the method of manufacturing an SOI substrate according to this embodiment. Referring to FIG. 1, the SOI substrate comprises a base wafer 2 of a silicon single crystal having resistivity of about 0.01 to 100000 Ωcm, a silicon oxide layer 5 formed on the surface of the base wafer 2, a silicon single-crystalline layer 4 of about 1 to 100 Ωcm in resistivity formed on the surface of the silicon oxide layer 5 and a silicon germanium single-crystalline layer 3 of about 0.001 to 0.1 Ωcm in resistivity formed on the surface of the silicon single-crystalline layer 4. The thicknesses of the silicon oxide layer 5, the silicon single-crystalline layer 4 and the silicon germanium single-crystalline layer 3 are 500 to 10000 nm, 20 to 500 nm and 5 to 50 nm respectively, for example.

Figure 2:
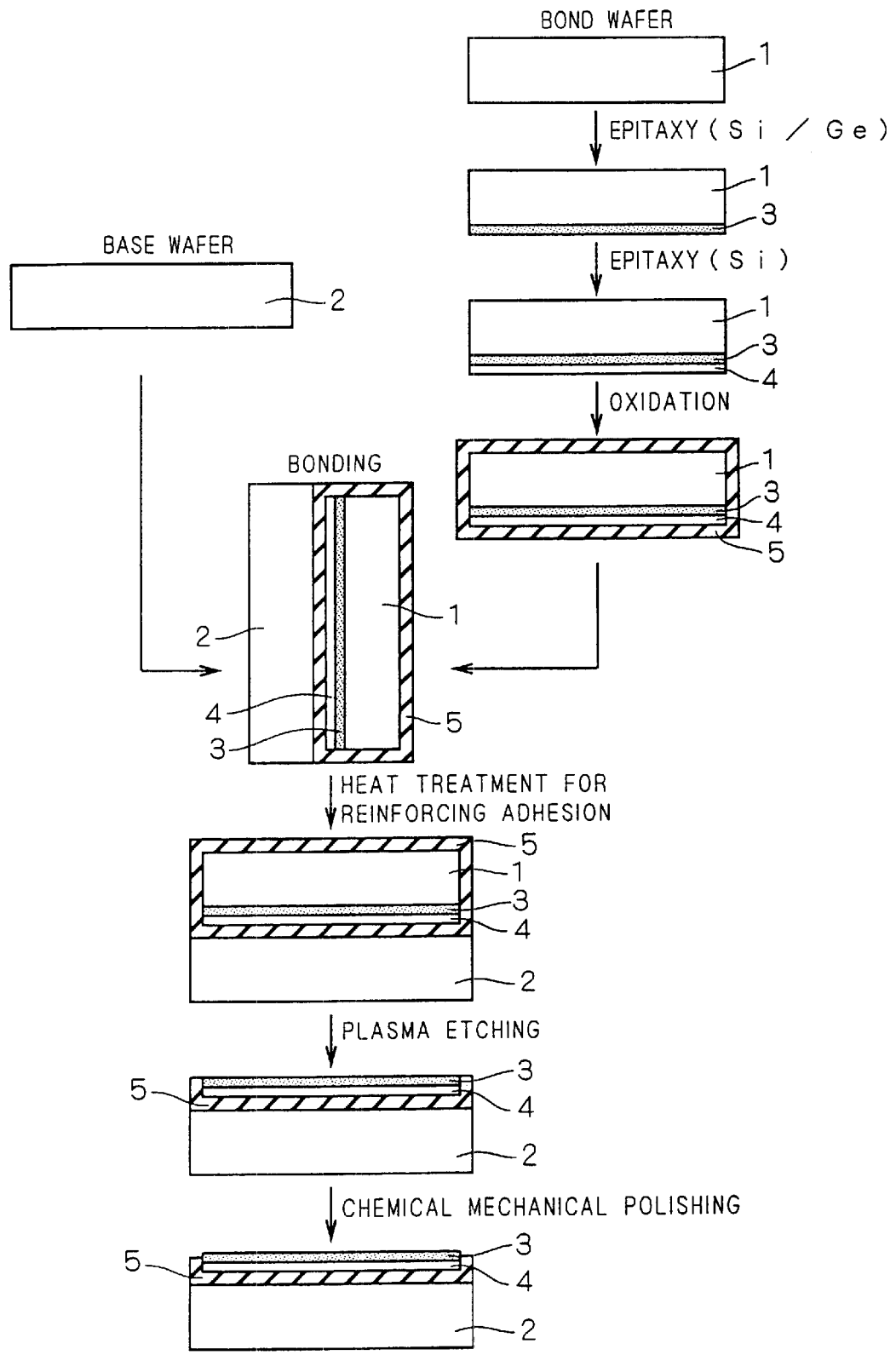
FIG. 2 illustrates sectional views showing steps of the method of manufacturing an SOI substrate according to the embodiment 1 of the present invention.

The method of manufacturing the SOI substrate shown in FIG. 1 is now described with reference to FIG. 2. First, a bond wafer 1 of a silicon single crystal sliced into a thickness of about 500 to 1000 μm is prepared. The silicon germanium single-crystalline layer 3 is formed on the main surface of the bond wafer 1 by epitaxy.

Then, the silicon single-crystalline layer 4 is formed on the surface of the silicon germanium single-crystalline layer 3 by epitaxy. Among the surfaces of the bond wafer 1, at least the surface of the silicon germanium single-crystalline layer 3 is oxidized for forming the silicon oxide layer 5 (the overall surfaces of the bond wafer 1 are oxidized as shown in FIG. 2, for example). Then, the base wafer 2 of a silicon single crystal sliced into a thickness of about 500 to 1000 μm similarly to the bond wafer 1 is bonded to the main surface of the bond wafer 1 formed with the silicon germanium single-crystalline layer 3. The bond wafer 1 and the base wafer 2 bonded to each other are heated to a temperature of at least 900° C., for example, for reinforcing adhesion therebetween.

The bond wafer 1 is removed by performing plasma etching with chlorine gas, for example, from the main surface opposite to that formed with the silicon germanium single-crystalline layer 3, for exposing the silicon germanium single-crystalline layer 3. At this time, the silicon germanium single-crystalline layer 3 serves as a stopper for the bond wafer 1.

Thereafter the silicon germanium single-crystalline layer 3 is polished by chemical mechanical polishing to have a prescribed thickness.

In the method of manufacturing an SOI substrate according to this embodiment, the silicon germanium single-crystalline layer 3 exhibits small irregularity in its crystal state and has selectivity for the silicon single crystal forming the bond wafer 1, whereby the silicon single-crystalline layer 4 hardly causes crystal defects and the bond wafer 1 can be reliably removed.

Further, silicon germanium has higher mobility of holes than silicon (the mobility can be about twice that in silicon), and hence the silicon germanium single-crystalline layer 3 can be employed as a device forming layer on the SOI substrate.

In addition, the silicon germanium single-crystalline layer 3 polished by chemical mechanical polishing can be brought into a thickness suitable for serving as a device forming layer.

Embodiment 2.

Figure 3:
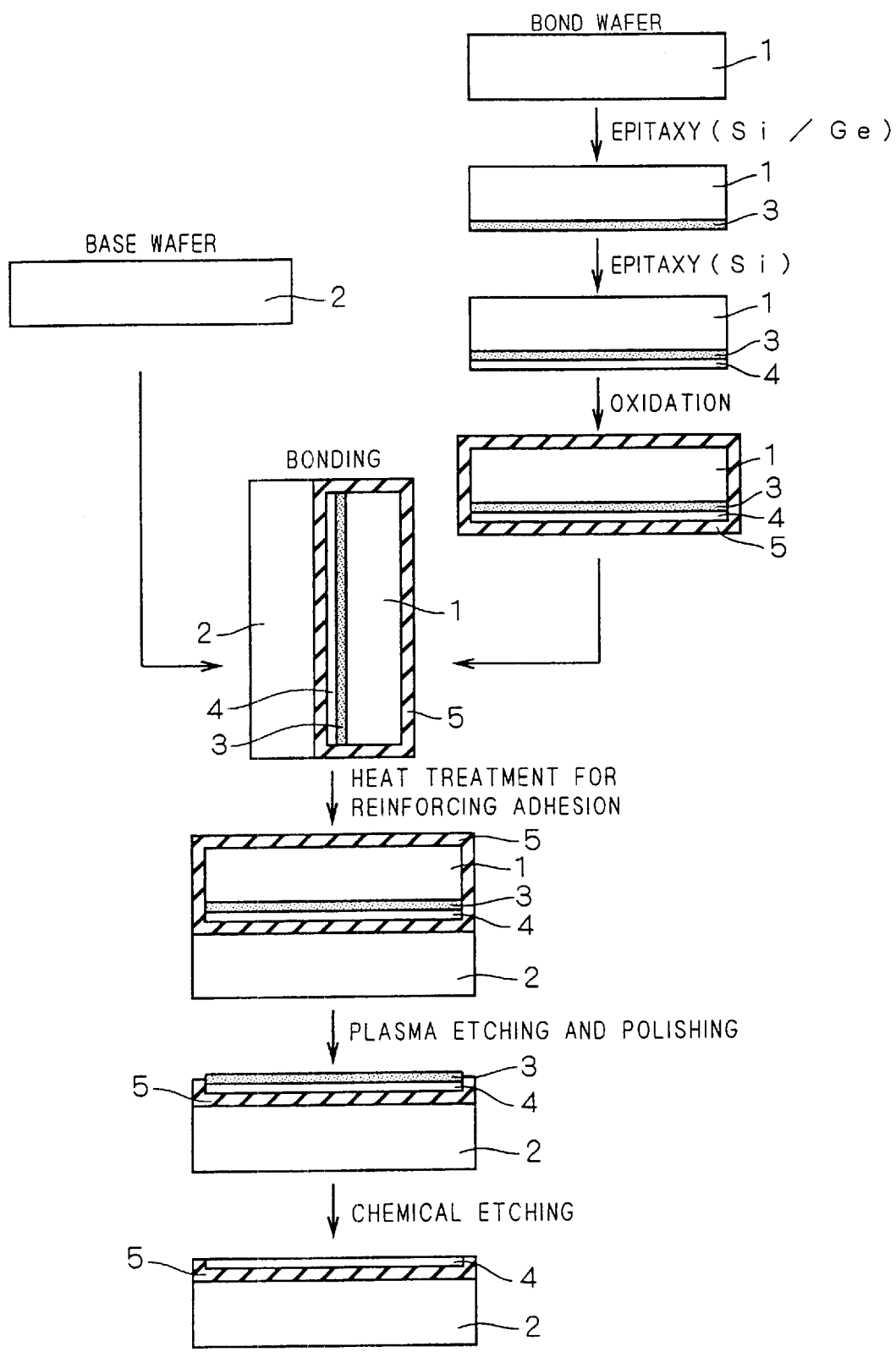
FIG. 3 illustrates sectional views showing steps of a method of manufacturing an SOI substrate according to an embodiment 2 of the present invention.

FIG. 3 illustrates an embodiment 2 of the present invention related to a modification of the method of manufacturing an SOI substrate according to the embodiment 1. Also in this embodiment, a silicon germanium single-crystalline layer 3 and a silicon single-crystalline layer 4 are successively epitaxially grown on the main surface of a bond wafer 1 consisting of a silicon single crystal. And a silicon oxide layer 5 is formed. Thereafter, a base wafer 2 consisting of a silicon single crystal is bonded to the bond wafer 1 and adhesion therebetween is reinforced by heat treatment similarly to the embodiment 1, as shown in FIG. 3.

Thereafter the bond wafer 1 is removed by performing plasma etching with chlorine gas, for example, from the main surface opposite to that formed with the silicon germanium single-crystalline layer 3. In this plasma etching, however, the etching time is so adjusted as not to completely remove the bond wafer 1 but to leave the same to some extent. The remaining part of the bond wafer 1, i.e., the part in contact with the silicon germanium single-crystalline layer 3 is removed by chemical mechanical polishing. At this time, the silicon germanium single-crystalline layer 3 serves as a stopper for the bond wafer 1. The bond wafer 1 is not removed only by plasma etching, in order not to damage the silicon germanium single-crystalline layer 3 by plasma. It is preferable to avoid such damage caused by plasma, which may result in crystal defects in the silicon germanium single-crystalline layer 3 as well as in the silicon single-crystalline layer 4. The remaining part of the bond wafer 1 may alternatively be removed by wet etching with a hydrofluoric acid solution, for example.

Further, the bond wafer 1 may be removed not by plasma etching and chemical mechanical polishing but by wet etching from the first.

Then, the base wafer 2 to which the multilayer structure of the silicon germanium single-crystalline layer 3, the silicon single-crystalline layer 4 and the silicon oxide layer 5 adheres is dipped in a mixed solution of a hydrofluoric acid solution, a nitric acid solution and an acetic acid solution thereby completely removing the exposed silicon germanium single-crystalline layer 3 by wet etching. In this wet etching, the silicon single-crystalline layer 4 serves as a stopper. No plasma etching is employed in this step so that the silicon single-crystalline layer 4 is not damaged by plasma and hardly causes crystal defects.

Thus, it is possible to obtain an SOI substrate of a general structure comprising only a buried silicon oxide layer and a silicon layer on a base wafer with no silicon germanium single-crystalline layer 3 dissimilarly to the structure shown in FIG. 1. In the SOI substrate obtained in the aforementioned manner, the silicon single-crystalline layer 4 hardly causing crystal defects as described above has a better crystal state than that in the SOI substrate manufactured according to the conventional method.

The silicon germanium single-crystalline layer 3 may not be completely removed but partially left by controlling the etching time for the wet etching, as a matter. of course. Also in this case, the crystal states of the silicon germanium single-crystalline layer 3 and the silicon single-crystalline layer 4 are kept excellent.

In the method of manufacturing an SOI substrate according to this embodiment, removal of the bond wafer 1 is finished not by plasma etching but by chemical mechanical polishing or wet etching, whereby the silicon germanium single-crystalline layer 3 has a little possibility of causing crystal defects. Further, the silicon germanium single-crystalline layer 3 is removed by wet etching, whereby the silicon single-crystalline layer 4 also has a little possibility of crystal defects.

Embodiment 3.

An embodiment 3 of the present invention relates to a method of manufacturing an SOI substrate including a step of patterning a silicon germanium single-crystalline layer 3 provided on an SOI substrate manufactured by the method according to the embodiment 1 or 2.

Figure 4:
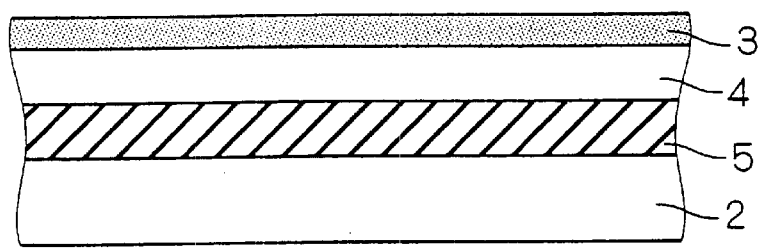
FIGS. 4 to 7 are sectional views showing respective stages of a method of manufacturing an SOI substrate according to an embodiment 3 of the present invention.
Figure 5:
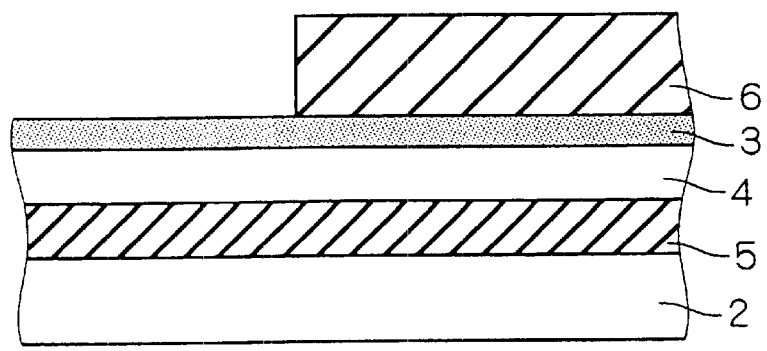

FIGS. 4 to 7 successively illustrate respective stages of the method of manufacturing an SOI substrate according to this embodiment. FIG. 4 shows the SOI substrate manufactured by the method according to the embodiment 1 or 2, similarly to FIG. 1. A mask layer 6 of photoresist or the like is formed on the surface of this SOI substrate and patterned into a prescribed pattern through photolithography (FIG. 5).

Figure 6:
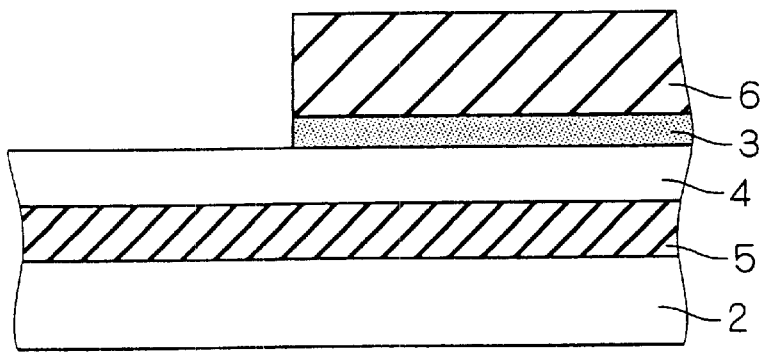
Figure 7:
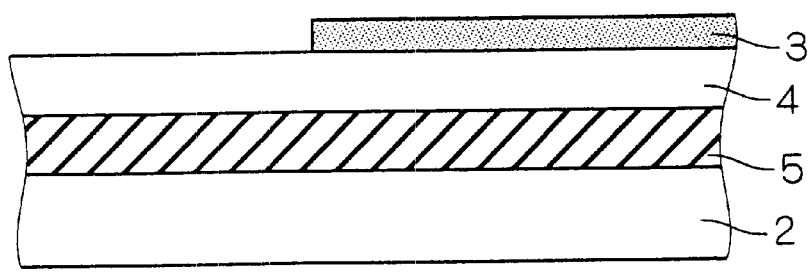

Then, a part of the silicon germanium single-crystalline layer 3 not covered with the mask layer 6 is removed by plasma etching with chlorine gas or boron gas, for example, through the patterned mask layer 6 serving as a mask (FIG. 6). Then, the mask layer 6 is removed (FIG. 7).

Before forming the mask layer 6, a silicon oxide film and a silicon nitride film may be formed on the surface of the silicon germanium single-crystalline layer 3, in order to protect the silicon germanium single-crystalline layer 3. In this case, the protective films may be removed after removing the mask layer 6.

In the method of manufacturing an SOI substrate according to this embodiment, the silicon germanium single-crystalline layer 3 can be arbitrarily patterned for serving as a device forming layer.

The method of manufacturing an SOI substrate according to this embodiment is applicable not only to the SOI substrate manufactured by the method according to the embodiment 1 or 2 but also to an SOI substrate manufactured in combination with the conventional method, for example, so far as the SOI substrate has the structure shown in FIG. 1.

Embodiment 4.

Figure 8:
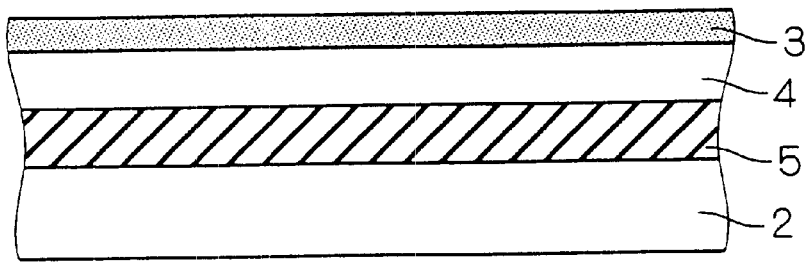
FIGS. 8 to 12 are sectional views showing respective stages of a method of manufacturing an SOI substrate according to an embodiment 4 of the present invention.

FIGS. 8 to 12 successively show a method of manufacturing an SOI substrate according to an embodiment 4 of the present invention, which is a modification of the method according to the embodiment 3. First, an SOI substrate manufactured by the method according to the embodiment 1 or 2 is prepared, similarly to the embodiment 3 (FIG. 8).

Figure 9:
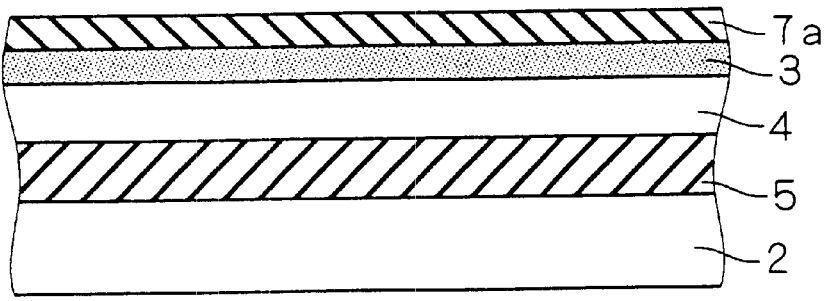

Then, a multilayer structure 7a of a silicon oxide film and a silicon nitride film is formed on the surface of the SOI substrate (FIG. 9). In the multilayer structure 7a, the silicon nitride film is formed on the upper surface of the silicon oxide film. The silicon nitride film serves as an anti-oxidation film in a later step, while the silicon oxide film prevents nitrogen contained in the silicon nitride film from permeating into a wafer surface. This multilayer structure 7a corresponds to the mask layer 6 in the embodiment 3. A photoresist film 7b is formed on the surface of the multilayer structure 7a, and patterned into a prescribed pattern through photolithography.

Figure 10:
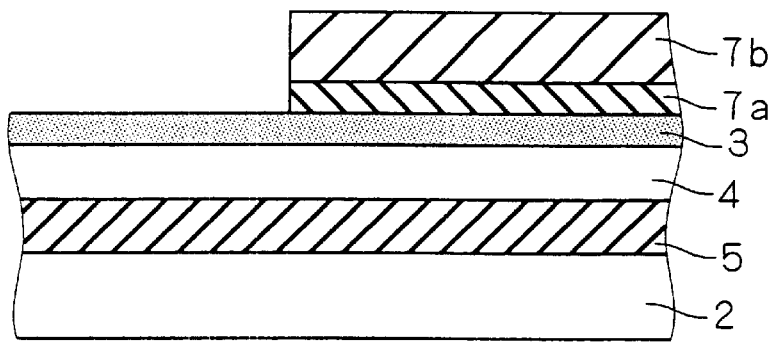
Figure 11:
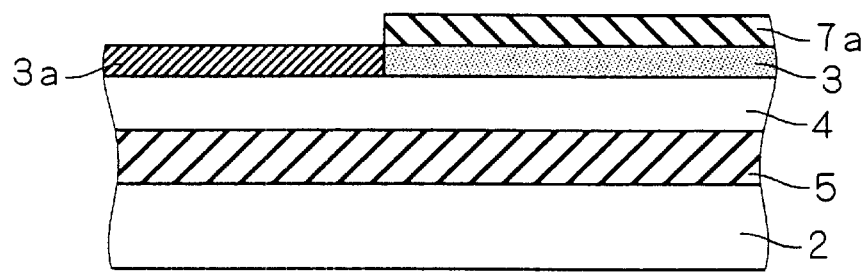

Then, plasma etching is performed with fluorine gas, for example, through the photoresist film 7b serving as a mask, thereby removing a part of the multilayer structure 7a not covered with the photoresist film 7b (FIG. 10). The remaining photoresist film 7b is removed and the wafer is heated in an oxygen atmosphere for oxidizing the exposed silicon germanium single-crystalline layer 3 and forming an oxidized silicon germanium single-crystalline layer 3a (FIG. 11). The silicon germanium single-crystalline layer 3 is oxidized to have selectivity for the silicon nitride film forming the multilayer structure 7a in a subsequent wet etching step.

Figure 12:
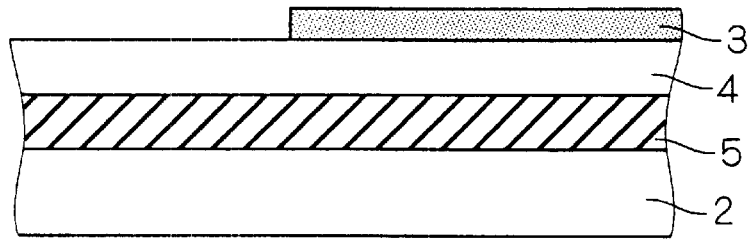

The oxidized part 3a of the silicon germanium single-crystalline layer 3 is removed by wet etching with a hydrofluoric acid solution, for example, and the remaining multilayer structure 7a is removed by wet etching with a phosphoric acid solution, for example (FIG. 12). The silicon nitride film and the silicon oxide film forming the multilayer structure 7a are removed by phosphoric acid, to have a little possibility of damaging the silicon germanium single-crystalline layer 3.

In the method of manufacturing an SOI substrate according to this embodiment, the oxidized silicon germanium single-crystalline layer 3a is removed not by plasma etching but by wet etching when arbitrarily patterning the silicon germanium single-crystalline layer 3 for serving as a device forming layer, whereby the silicon germanium single-crystalline layer 3 and a silicon single-crystalline layer have a little possibility of causing crystal defects.

The method of manufacturing an SOI substrate according to this embodiment is also applicable not only to the SOI substrate manufactured by the method according to the embodiment 1 or 2 but also to an SOI substrate manufactured in combination with the conventional method, for example, so far as the SOI substrate has the structure shown in FIG. 1.

Embodiment 5.

An embodiment 5 of the present invention relates to a method of manufacturing an SOI substrate including a step of forming a DRAM element on an SOI substrate manufactured by the method according to the embodiment 1 or 2.

Figure 13:
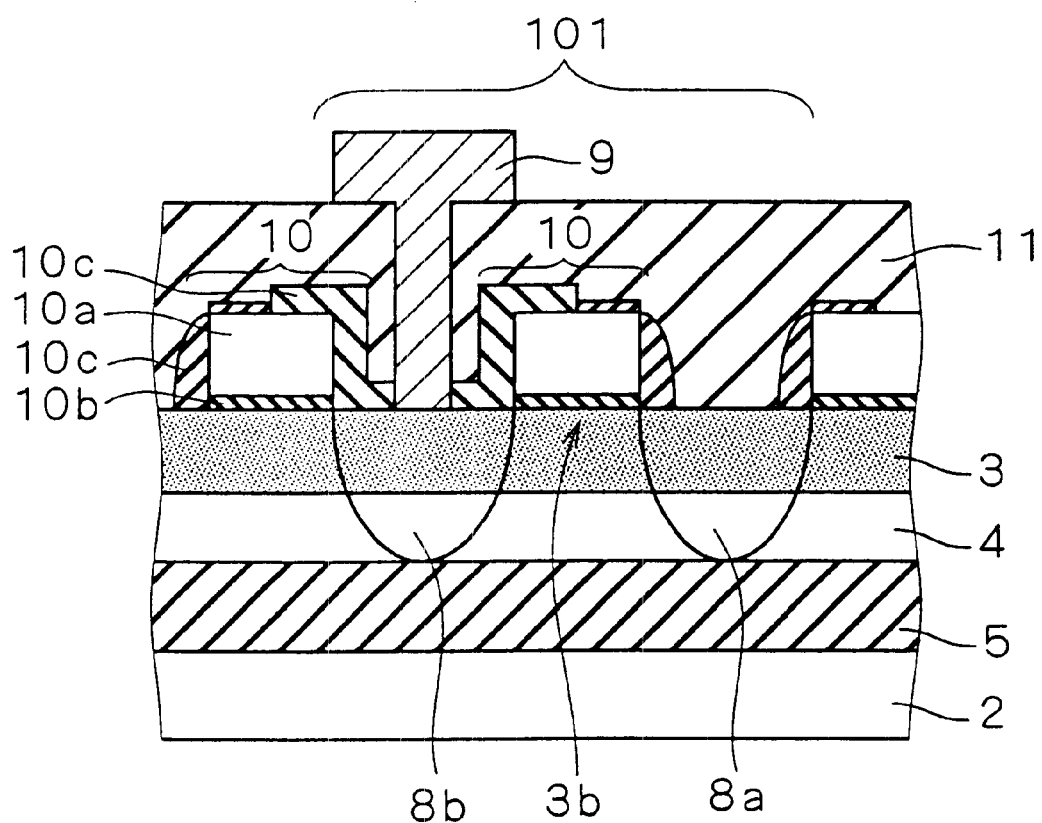
FIG. 13 is a sectional view showing a memory cell part of a DRAM element formed by a method of manufacturing an SOI substrate according to an embodiment 5 of the present invention.

FIG. 13 is a sectional view of a memory cell part included in components of a DRAM element, formed on the SOI substrate shown in FIG. 1, showing a MOSFET 101 and a storage node 9. The MOSFET 101 consists of diffusion regions 8a and 8b formed in the silicon germanium single-crystalline layer 3 and the silicon single-crystalline layer 4 for serving as source/drain regions and a MOS gate structure 10, while the storage node 9 is connected to the diffusion region 8b. The MOS gate structure 10 comprises a gate electrode 10a, a gate insulating film 10b and side walls 10c.

Storage information is written in a DRAM memory cell in the following manner: It is assumed that charges such as electrons are stored in or depleted from the storage node 9, which in turn has a prescribed potential, for example. The potential of a bit line (not shown) connected to the diffusion region 8a is fixed higher or lower than a prescribed value for causing prescribed potential difference between the bit line and the storage node 9. A voltage of desired polarity is applied to the gate electrode 10a of the MOSFET 101 for forming an inversion layer on a channel part 3b located immediately under the gate electrode 10a. The charges such as electrons move between the bit line and the storage node 9, to equalize the potentials thereof to each other. Thereafter application of the voltage to the gate electrode 10a is stopped and the gate of the MOSFET 101 is closed, thereby writing the information in the storage node 9.

On the other hand, storage information is read from the DRAM memory cell (whether the potential of the storage node 9 is higher or lower than the prescribed value is determined) as follows: After setting a closed circuit state while keeping the potential of the bit line at the aforementioned prescribed value, a voltage of desired polarity is applied to the gate electrode 10a of the MOSFET 101 for forming an inversion layer on the channel part 3b located immediately under the gate electrode 10a. The charges such as electrons move between the bit line and the storage node 9, to equalize the potentials thereof to each other. At this time, a sense amplifier (not shown) connected to the bit line recognizes change of the potential of the bit line slightly rising or lowering from the initial value for reading the information from the storage node 9.

The components of the DRAM element are formed by a conventional technique. First, an SOI substrate manufactured by the method according to the embodiment 1 or 2 is prepared for forming an insulating film serving as the material for the gate insulating film 10b on its surface, and a conductive film serving as the material for the gate electrode 10a is formed thereon. Thereafter these films are patterned for forming the gate electrode 10a and the gate insulating film 10b. The diffusion regions 8a and 8b are formed in the silicon germanium single-crystalline layer 3 and the silicon single-crystalline layer 4 provided on the surface of the SOI substrate by ion implantation or the like, an insulating film is formed to cover the surfaces of the MOS gate structure 10 and the diffusion regions 8a and 8b, and thereafter the side walls 10c are formed by etchback or the like. While the MOSFET 101 is completely formed in this stage, an interlayer isolation film 11 is thereafter formed to cover the overall surface of the SOI substrate, via holes are formed to attain connection with the diffusion regions 8a and 8b through the interlayer isolation film 11, and the bit line and the storage node 9 are formed in the via holes and on the interlayer isolation film 11 respectively. The bit line and the storage node 9 may be formed on the same layer or on different interlayer isolation films.

While the above steps have been described with reference to the memory cell part, a MOSFET or the like may be similarly formed in each of the remaining components of the DRAM element such as a sense amplifier, for example.

Silicon germanium has higher mobility of holes as compared with silicon as described with reference to the embodiment 1, and hence it is effective to employ the silicon germanium single-crystalline layer 3 as a device forming layer on the SOI substrate. When forming a P-channel MOSFET included in MOSFETs employed for the aforementioned DRAM element on the surface of the silicon germanium single-crystalline layer 3 as shown in FIG. 13, therefore, the P-channel MOSFET can attain a high carrier speed.

In the method of manufacturing an SOI substrate according to this embodiment, the crystal state of the silicon germanium single-crystalline layer 3 is so excellent that a MOSFET having excellent break-down voltage can be manufactured. Further, the mobility of holes is higher than that in silicon, and hence the operating speed of the P-channel MOSFET can be increased.

Embodiment 6.

An embodiment 6 of the present invention relates to a method of manufacturing an SOI substrate including a step of forming a CMOSFET on an SOI substrate manufactured by the method according to the embodiment 1 or 2.

Figure 14:
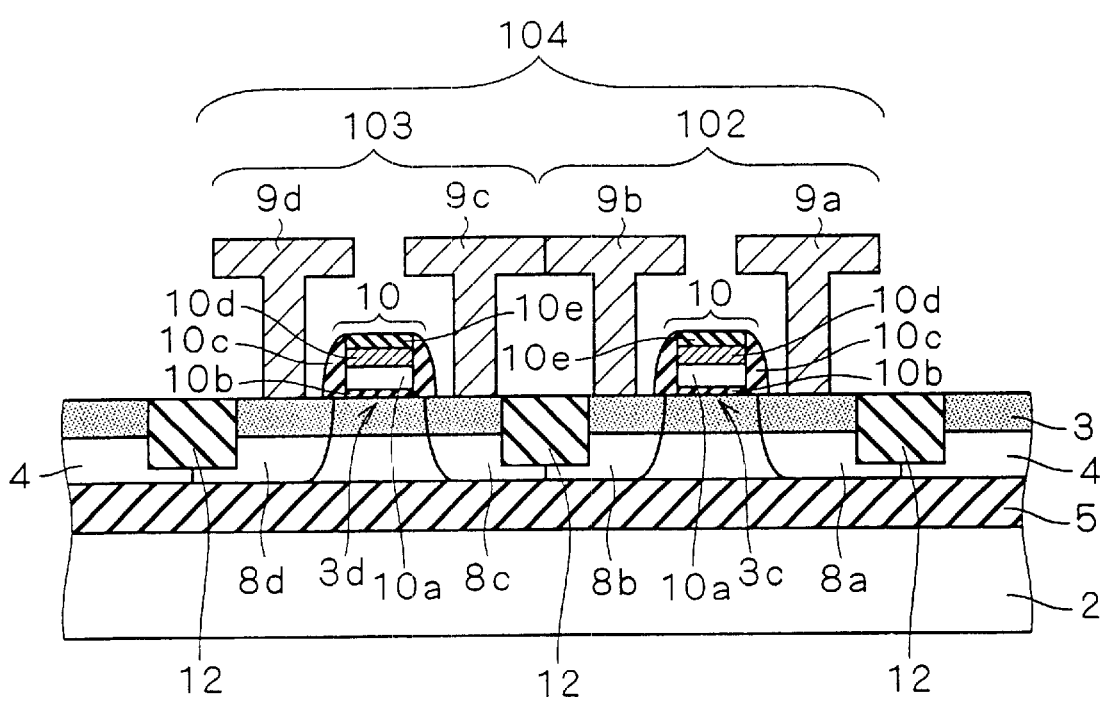
FIG. 14 is a sectional view showing a CMOSFET formed by a method of manufacturing an SOI substrate according to an embodiment 6 of the present invention.

FIG. 14 is a sectional view showing a CMOSFET 104 formed on the SOI substrate shown in FIG. 1 with N- and P-channel MOSFETs 102 and 103 and wires 9a to 9d isolated by element isolation regions 12. The N- and P-channel MOSFETs 102 and 103 are formed in proximity to each other, and the N-channel MOSFET 102 consists of diffusion regions 8a and 8b formed in the silicon germanium single-crystalline layer 3 and the silicon single-crystalline layer 4 and a MOS gate structure 10, while the P-channel MOSFET 103 consists of diffusion regions 8c and 8d and a MOS gate structure 10. Each MOS gate structure 10 comprises a gate electrode 10a, a gate insulating film 10b and side walls 10c as well as a polycide region 10d and a mask 10e employed for shaping the polycide region 10d. The wires 9a to 9d are connected to the diffusion regions 8a to 8d respectively. The wires 9b and 9c are connected to each other.

Operations of the CMOSFET 104 are as follows: When the potential of the wire 9b is higher than that of the wire 9a, electrons are externally transferred to the wire 9a and a voltage higher than that of the wire 9a is applied to the gate electrode 10a of the N-channel MOSFET 102, for example, an inversion layer is formed on a channel part 3c located immediately under the gate structure 10 and the transferred electrons move to the wire 9b through the diffusion region 8a, the channel part 3c and the diffusion region 8b and act to lower the potential of the wire 9b. When the potential of the wire 9c is lower than that of the wire 9d, holes are externally transferred to the wire 9d and a voltage lower than that of the wire 9d is applied to the gate electrode 10a of the P-channel MOSFET 103, on the other hand, an inversion layer is formed on a channel part 3d located immediately under the gate structure 10 and the transferred electrons move to the wire 9c through the diffusion region 8d, the channel part 3d and the diffusion region 8c and act to raise the potential of the wire 9c.

Such a CMOSFET 104 is formed by a conventional technique. First, an SOI substrate manufactured by the method according to the embodiment 1 or 2 is prepared for forming the element isolation regions 12 on its surface. Then, insulating films serving as the materials for the gate insulating films 10b are formed on the surface of the SOI substrate, and conductive films serving as the materials for the gate electrodes 10a are formed further thereon. Thereafter metal films are further formed and heat-treated for forming polycide regions. Thereafter patterned mask layers 10e are formed and regions not provided with the mask layers 10e are removed for forming the gate electrodes 10a, the gate insulating films 10b and the polycide regions 10d. The diffusion regions 8a to 8d are formed in the silicon germanium single-crystalline layer 3 and the silicon single-crystalline layer 4 provided on the surface of the SOI substrate by ion implantation or the like, an insulating film is formed to cover the surfaces of the MOS gate structures 10 and the diffusion regions 8a and 8b, and thereafter the side walls 10c are formed by etchback or the like. While the MOSFETs 102 and 103 are completely formed in this stage, an interlayer isolation film (not shown) is thereafter formed to cover the overall surface of the SOI substrate and via holes are formed in the interlayer isolation film for forming the wires 9a to 9d.

Also in the aforementioned CMOSFET 104, a P-channel MOSFET having a high carrier speed can be obtained by forming the P-channel MOSFET 103 on the surface of the silicon germanium single-crystalline layer 3.

In the method of manufacturing an SOI substrate according to this embodiment, the crystal state of the silicon germanium single-crystalline layer 3 is so excellent that a CMOSFET having excellent break-down voltage can be manufactured. Further, the mobility of holes is higher than that in silicon and hence the operating speed of the P-channel MOSFET 103 can be increased.

Embodiment 7.

An embodiment 7 of the present invention relates to a method of manufacturing an SOI substrate including a step of forming an infrared detector on an SOI substrate manufactured by the method according to the embodiment 1 or 2.

Figure 15:
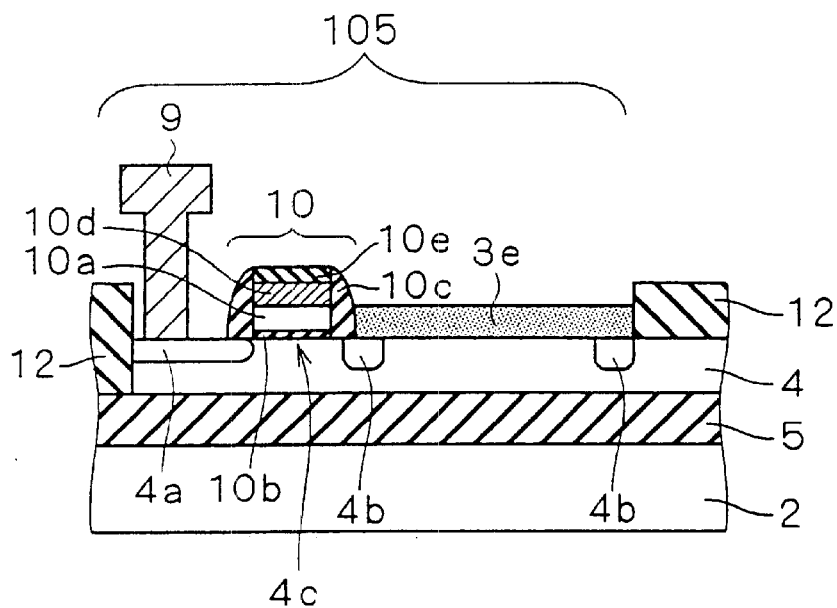
FIG. 15 is a sectional view showing an infrared detector formed by a method of manufacturing an SOI substrate according to an embodiment 7 of the present invention.
Figure 16:
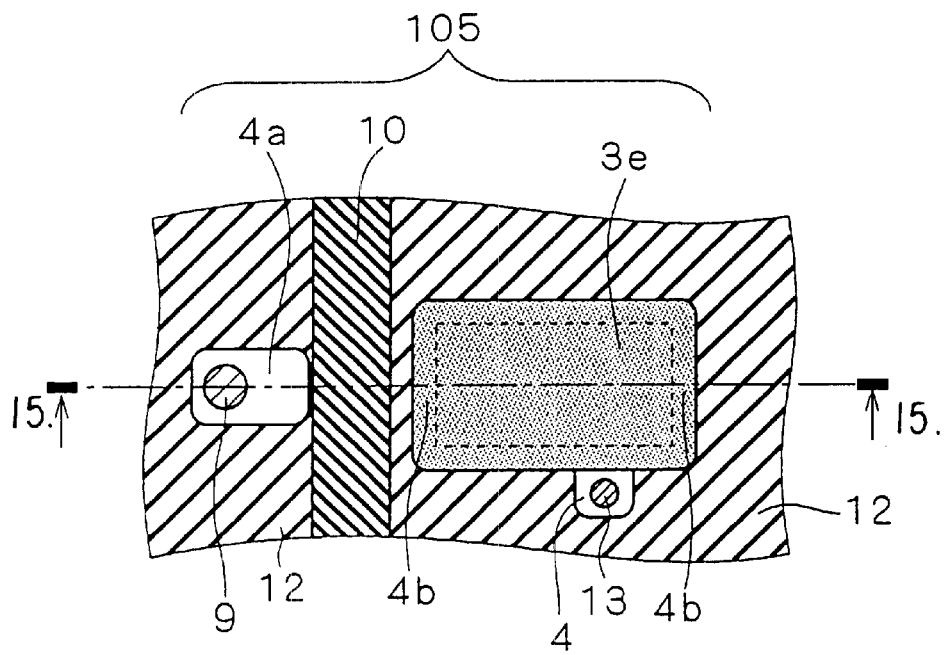
FIG. 16 is a top plan view of the infrared detector formed by the method of manufacturing an SOI substrate according to the embodiment 7 of the present invention.

FIG. 15 shows an infrared detector 105 formed on the SOI substrate shown in FIG. 1, with a MOS gate structure 10, diffusion regions 4a and 4b, an infrared detection part 3e, a wire 9 and element isolation regions 12. FIG. 16 is a top plan view of the infrared detector 105 (FIG. 15 is a sectional view taken along the line 15–15 in FIG. 16). The diffusion regions (regions having resistivity of about 0.01 to 0.1 Ωcm and containing an impurity reverse in characteristic to the silicon single-crystalline layer 4) 4a and 4b are formed in proximity to the MOS gate structure 10 in the silicon single-crystalline layer 4, and the wire 9 is connected to the diffusion region 4a. The MOS gate structure 10 comprises a gate electrode 10a, a gate insulating film 10b and side walls 10c as well as a polycide region 10d and a mask 10e employed for forming the polycide region 10d. The silicon germanium single-crystalline layer 3, the periphery of which is enclosed with the diffusion region 4b, is formed as the infrared detection part 3e. The silicon germanium single-crystalline layer 3 preferably so formed that the ratio of concentration of silicon to germanium is about 3.5 to 2.5:1 in atomic percentage and the concentration of an impurity added to the silicon germanium single-crystalline layer 3 is preferably adjusted, so that the silicon germanium single-crystalline layer 3 is preferably adjusted, so that the silicon germanium single-crystalline layer 3 detects infrared rays. The silicon single-crystalline layer 4 adjacent to the diffusion region 4b is connected with a wire 13, which is supplied with a fixed potential of 0 V, for example.

Operations of the infrared detector 105 are as follows: The following description is made with reference to the silicon single-crystalline layer 4 of a P type and the diffusion regions 4a and 4b of an N type. When applying a positive voltage to the gate electrode 10a while applying a positive voltage to the wire 9, electrons are discharged from the infrared detection part 3e through the diffusion region 4b, a channel part 4c located immediately under the gate structure 10, the diffusion region 4a and the wire 9. When stopping the voltage application to the gate electrode 10a in this state, it follows that holes of a high density locally exist in the infrared detection part 3e as free carriers and the infrared detection part 3e has a positive potential with respect to the silicon single-crystalline layer 4.

If infrared rays are incident upon the infrared detection part 3e, electron-hole pairs are generated due to the energy of the infrared rays so that holes capable of passing through an energy barrier formed on the heterojunction interface between the infrared detection part 3e and the silicon single-crystalline layer 4 are released into the silicon single-crystalline layer 4 and extracted through the wire 13. The holes are so extracted as to prevent the potential of the silicon single-crystalline layer 4 from increasing due to storage of the holes and relaxing the potential difference between the silicon single-crystalline layer 4 and the infrared detection part 3e and to prevent reduction of the ON-state voltage of the MOSFET 105 as well as generation of a leakage current between the diffusion regions 4a and 4b (the wire 13 is preferably provided on the surface since it is difficult to extract carriers from the back surface of the SOI substrate).

A positive voltage is applied to the gate electrode 10a again so that electrons remaining in the infrared detection part 3e are read through the diffusion region 4b, the channel part 4c located immediately under the gate structure 10, the diffusion region 4a and the wire 9. A current detector (not shown) connected to the wire 9 reads the electrons as a current for detecting incidence of the infrared rays. The infrared rays can also be detected by employing a CCD element in place of the MOSFET 105.

This infrared detector 105 is formed as follows: First, an SOI substrate manufactured by the method according to the embodiment 1 or 2 is prepared for forming the infrared detection part 3e on its surface by the method according to the embodiment 3 or 4. The element isolation regions 12 are formed by the conventional technique and an insulating film serving as the material for the gate insulating film 10b is formed on the surface of the SOI substrate while a conductive film serving as the material for the gate electrode 10a is formed further thereon. Thereafter a metal film is further formed and heat-treated for forming a polycide region. Thereafter the patterned mask layer 10e is formed and a region not provided with the mask layer 10e is removed for forming the gate electrode 10a, the gate insulating film 10b and the polycide region 10d. The diffusion regions 4a and 4b are formed in parts of the silicon single-crystalline layer 4 provided on the surface of the SOI substrate and located immediately under the outer periphery of the infrared detection part 3e through ion implantation or the like, an insulating film is formed to cover the surfaces of the MOS gate structure 10 and the infrared detection part 3e, and thereafter the side walls 10c are formed by etchback or the like. Thereafter an interlayer isolation film (not shown) is formed to cover the overall surface of the SOI substrate and via holes are formed in the interlayer isolation film for forming the wires 9 and 13.

In the method of manufacturing an SOI substrate according to this embodiment, the crystal state of the silicon germanium single-crystalline layer 3 is so excellent that an infrared detector having excellent detection sensitivity can be manufactured.

Embodiment 8.

An embodiment 8 of the present invention relates to a method of manufacturing an SOI substrate including a step of forming a CMOSFET on an SOI substrate manufactured by the method according to the embodiment 3 or 4.

Figure 17:
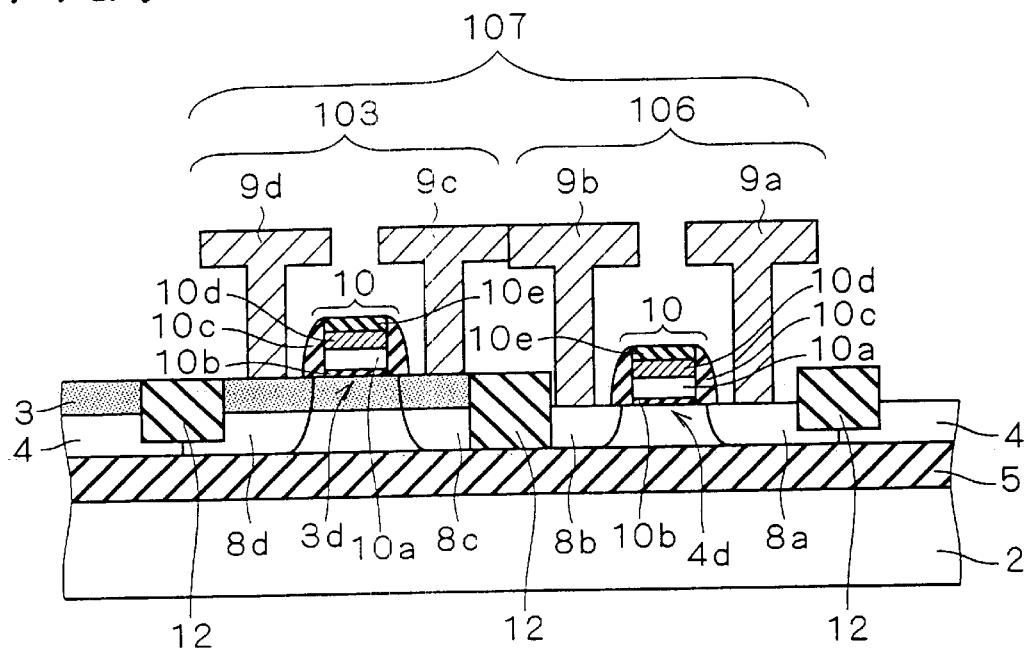
FIG. 17 is a sectional view showing a CMOSFET formed by a method of manufacturing an SOI substrate according to an embodiment 8 of the present invention.

FIG. 17 shows a section of a CMOSFET 107 formed on the SOI substrate shown in FIG. 7 or 12 with wires 9a to 9d and an N-channel MOSFET 106 and a P-channel MOSFET 103 isolated by element isolation regions 12. The N- and P-channel MOSFETs 106 and 103 are formed in proximity to each other on a region from which the silicon germanium single-crystalline layer 3 is removed and on the remaining region of the silicon germanium single-crystalline layer 3 respectively. The N-channel MOSFET 106 consists of diffusion regions 8a and 8b formed in the silicon single-crystalline layer 4 and a MOS gate structure 10, while the P-channel MOSFET 103 consists of diffusion regions 8c and 8d and a MOS gate structure 10. Each MOS gate structure 10 comprises a gate electrode 10a, a gate insulating film 10b and side walls 10*c* as well as a polycide region 10*d* and a mask 10*e* employed for forming the polycide region 10*d*. The diffusion regions 8*a* to 8*d* are connected with wires 9*a* to 9*d* respectively. The wires 9*b* and 9*c* are connected to each other.

Operations of the CMOSFET 107 are similar to those described with reference to the embodiment 6.

This CMOSFET 106 is formed by a conventional technique, similarly to that described with reference to the embodiment 6. First, an SOI substrate manufactured by the method according to the embodiment 3 or 4 is prepared for forming the element isolation regions 12 on its surface. Insulating films serving as the materials for the gate insulating films 10*b* are formed on the surface of the SOI substrate and conductive films serving as the materials for the gate electrodes 10*a* are further formed thereon. Thereafter metal films are further formed and heat-treated for forming polycide regions. Thereafter the patterned mask layers 10*e* are formed for removing regions not provided with the mask layers 10*e* and forming the gate electrodes 10*a*, the gate insulating films 10*b* and the polycide regions 10*d*. The diffusion regions 8*a* to 8*d* are formed in the silicon germanium single-crystalline layer 3 and the silicon single-crystalline layer 4 provided on the surface of the SOI substrate by ion implantation or the like, an insulating film is formed to cover the surfaces of the MOS gate structures 10 and the diffusion regions 8*a* and 8*b* and thereafter the side walls 10*c* are formed by etchback or the like. While the MOSFETs 106 and 103 are completely formed in this stage, an interlayer isolation film (not shown) is thereafter formed to cover the overall surface of the SOI substrate and via holes are formed in this interlayer isolation film for forming the wires 9*a* to 9*d*.

Also in the aforementioned CMOSFET 107, the P-channel MOSFET 103 formed on the surface of the silicon germanium single-crystalline layer 3 can attain a high carrier speed.

The silicon single-crystalline layer 4 has higher mobility of electrons than the silicon germanium single-crystalline layer 3 and hence the carrier speed of the N-channel MOSFET 106 is not reduced when forming the N-channel MOSFET 106 not on the surface of the silicon germanium single-crystalline layer 3 but on the surface of the silicon single-crystalline layer 4.

In the method of manufacturing an SOI substrate according to this embodiment, the crystal state of the silicon germanium single-crystalline layer 3 is so excellent that a CMOSFET having excellent break-down voltage can be manufactured. Further, the mobility of holes is higher than that in silicon and hence the operating speed of the P-channel MOSFET 103 can be increased. In addition, the silicon single-crystalline layer 4 is employed as a channel of the N-channel MOSFET 106, whereby the operating speed of the N-channel MOSFET 106 is higher than that in the case of employing the silicon germanium single-crystalline layer 3 as the channel.

Embodiment 9.

An embodiment 9 of the present invention relates to a method of manufacturing an SOI substrate including a step of forming an infrared detector and an N-channel MOSFET on an SOI substrate manufactured by the method according to the embodiment 3 or 4.

Figure 18:
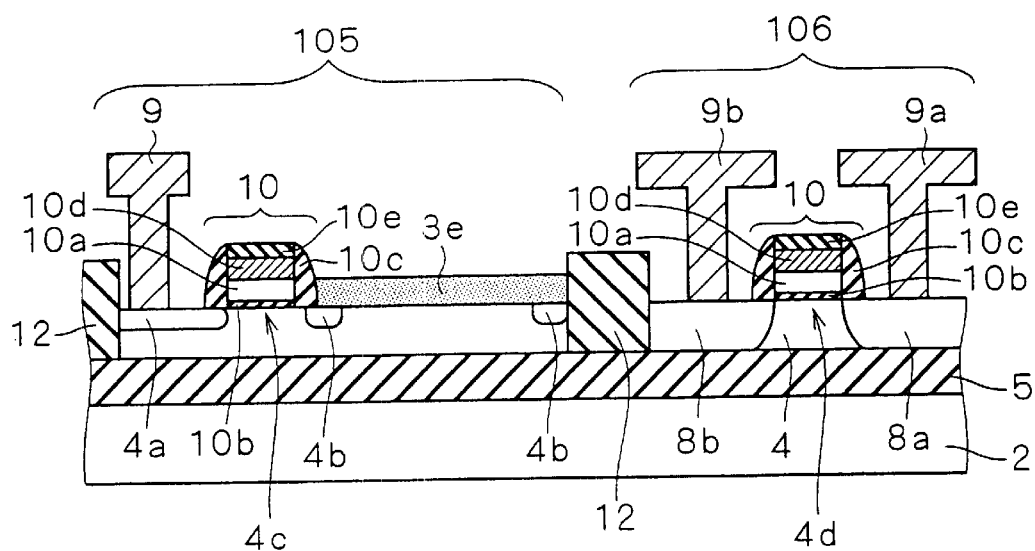
FIG. 18 is a sectional view showing an infrared detector and an N-channel MOSFET formed by a method of manufacturing an SOI substrate according to an embodiment 9 of the present invention.

FIG. 18 shows sections of an infrared detector 105 and an N-channel MOSFET 106 formed on the SOI substrate shown in FIG. 7 or 12, with MOS gate structures 10, diffusion regions 4*a* and 4*b*, an infrared detector 3*e*, a wire 9 and the N-channel MOSFET 106 isolated by an element isolation region 12. This structure is obtained by combining the infrared detector 105 described with reference to the embodiment 7 and the N-channel MOSFET 106 of the CMOSFET 107 described with reference to the embodiment 8.

Therefore, operations of the infrared detector 105 and the N-channel MOSFET 106 are identical to those described with reference to the embodiments 7 and 8.

The infrared detector 105 and the N-channel MOSFET 106 are formed as follows: First, an SOI substrate manufactured by the method according to the embodiment 1 or 2 is prepared for forming the infrared detection part 3*e* on its surface by the method according to the embodiment 3 or 4. The element isolation region 12 is formed by a conventional technique, insulating films serving as the materials for the gate insulating films 10*b* are formed on the surface of the SOI substrate, and conductive films serving as the materials for the gate electrodes 10*a* are further formed thereon. Thereafter metal films are further formed and heat-treated for forming polycide regions. Thereafter patterned mask layers 10*e* are formed and regions not provided with the mask layers 10*e* are removed for forming the gate electrodes 10*a*, the gate insulating films 10*b* and polycide regions 10*d*. The diffusion regions 4*a*, 4*b*, 8*a* and 8*b* are formed on parts of a silicon single-crystalline layer 4 provided on the surface of the SOI substrate and located immediately under the infrared detection part 3*e* by ion implantation or the like, an insulating film is formed to cover the surfaces of the MOS gate structures 10 and the infrared detector 3*e* and thereafter side walls 10*c* are formed through etchback or the like. Thereafter an interlayer isolation film (not shown) is formed to cover the overall surface of the SOI substrate and via holes are formed in the interlayer isolation film for forming the wires 9, 13, 9*a* and 9*b*.

In the method of manufacturing an SOI substrate according to this embodiment, the crystal state of the silicon germanium single-crystalline layer 3 is so excellent that an infrared detector having excellent detection sensitivity can be manufactured. Further, the silicon single-crystalline layer 4 is employed as a channel of the N-channel MOSFET 106, whereby the operating speed of the N-channel MOSFET 106 is higher than that in the case of employing the silicon germanium single-crystalline layer 3 as the channel.

Embodiment 10.

An embodiment 10 of the present invention relates to a method of manufacturing an SOI substrate including a step of forming a heterojunction bipolar transistor and an N-channel MOSFET on an SOI substrate manufactured by the method according to the embodiment 3 or 4.

Figure 19:
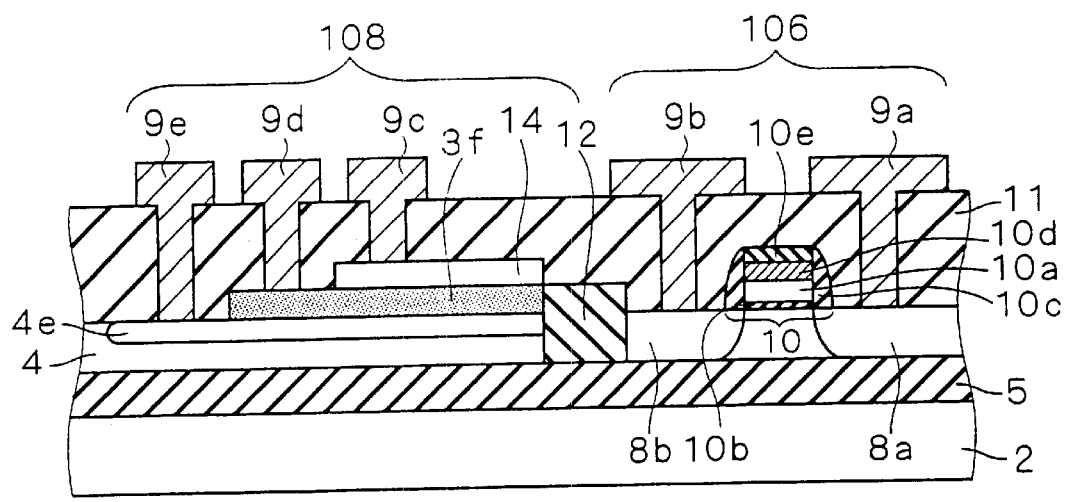
FIG. 19 is a sectional view showing a heterojunction bipolar transistor and an N-channel MOSFET formed by a method of manufacturing an SOI substrate according to an embodiment 10 of the present invention.

FIG. 19 shows sections of a heterojunction bipolar transistor 108 and an N-channel MOSFET 106 formed on the SOI substrate shown in FIG. 7 or 12, with an emitter layer 4*e*, a base layer 3*f*, a collector layer 14, wires 9*a* to 9*e* and the N-channel MOSFET 106 isolated by an element isolation region 12. This structure is obtained by combining the heterojunction bipolar transistor 108 with the N-channel MOSFET 106 of the CMOSFET 107 described with reference to the embodiment 8. Therefore, operations of the N-channel MOSFET 106 are identical to those described with reference to the embodiment 8.

Operations of the heterojunction bipolar transistor 108 are as follows: With reference to an NPN type, for example, carriers in the collector layer 14 move to the emitter layer 4*e* through the base layer 3*f* due to current injection into the wire 9*d* (base layer 3*f*) if potential difference is provided between the wire 9c (collector layer 14) and the wire 9e (emitter layer 4e), to feed a current having strength of about 100 times the current injected into the wire 9d.

While a silicon single-crystalline layer 4e is employed as the emitter layer and a silicon single-crystalline layer 14 is employed as the collector layer in this embodiment, the silicon single-crystalline layer 14 and the silicon single-crystalline layer 4e may contrarily be employed as the emitter layer and the collector layer respectively, as a matter of course.

Figure 20:
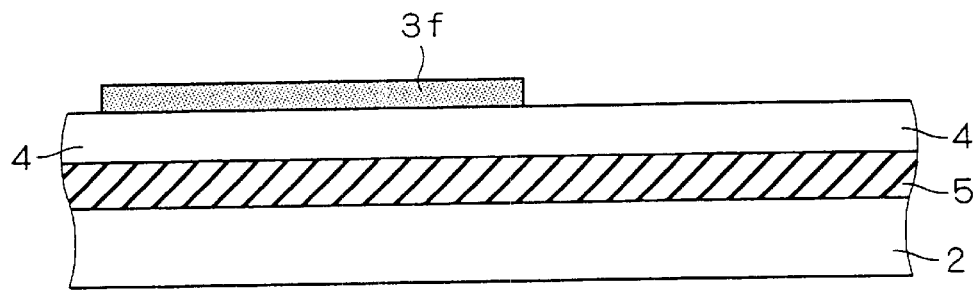
FIGS. 20 to 25 are sectional views showing respective stages of the method of manufacturing an SOI substrate according to the embodiment 10 of the present invention.
Figure 21:
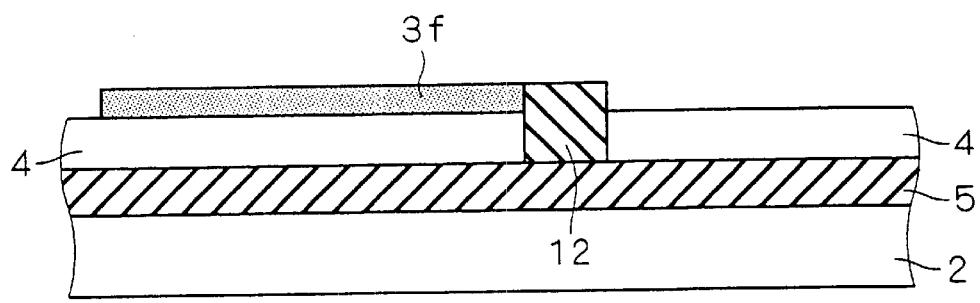
Figure 22:
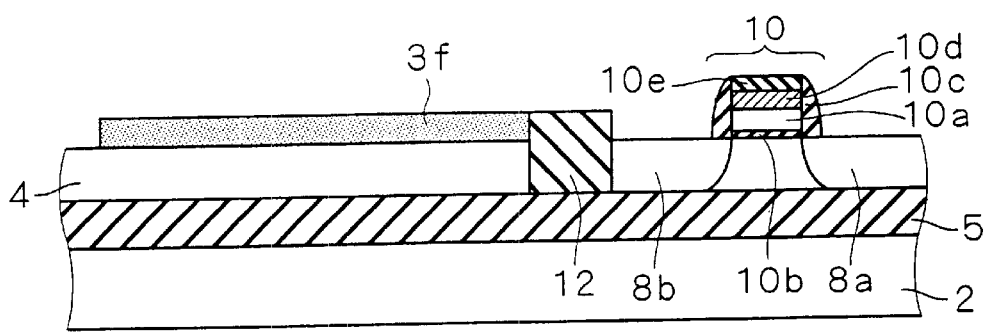

The heterojunction bipolar transistor 108 and the N-channel MOSFET 106 are formed as follows: First, an SOI substrate manufactured by the method according to the embodiment 3 or 4 is prepared (FIG. 20). The element isolation region 12 is formed by a conventional technique (FIG. 21), an insulating film serving as the material for the gate insulating film 10b is formed on the surface of the SOI substrate, and a conductive film serving as the material for the gate electrode 10a is further formed thereon. Thereafter a metal film is further formed and heat-treated for forming a polycide region. Thereafter a patterned mask layer 10e is formed and a region not provided with the mask layer 10e is removed for forming the gate electrode 10a, the gate insulating film 10b and a polycide region 10d. The diffusion regions 8a and 8b are formed in the silicon single-crystalline layer 4 provided on the surface of the SOI substrate by ion implantation or the like while covering the surface of a silicon germanium single-crystalline layer 3f with a protective film of photoresist or the like. The protective film is removed, thereafter an insulating film is formed to cover the surfaces of the MOS gate structure 10 and the silicon germanium single-crystalline layer 3f, and the side walls 10c are formed by etchback or the like (FIG. 22).

Then, the region of the N-channel MOSFET 106 is covered with a protective film of photoresist or the like for implanting impurity ions into the silicon germanium single-crystalline layer 3f and the silicon single-crystalline layer 4 located immediately under the same and injecting carriers. In case of forming an NPN type, for example, N-type impurity ions of a high concentration are implanted into the silicon single-crystalline layer 4 and thereafter P-type impurity ions of a high concentration are implanted into the silicon germanium single-crystalline layer 3f. In case of a PNP type, the characteristics of the impurity ions may be reversed.

The protective film is removed from the N-channel MOSFET 106, thereafter an interlayer isolation film 11 is formed on the overall surface and the surface part of the silicon germanium single-crystalline layer 3f is opened through photolithography. Then, the silicon single-crystalline layer 14 is epitaxially grown on the surface part of the silicon germanium single-crystalline layer 3f. At this time, the crystal state of the silicon germanium single-crystalline layer 3 is so excellent that a heterojunction having a small amount of interfacial states can be formed.

Figure 23:
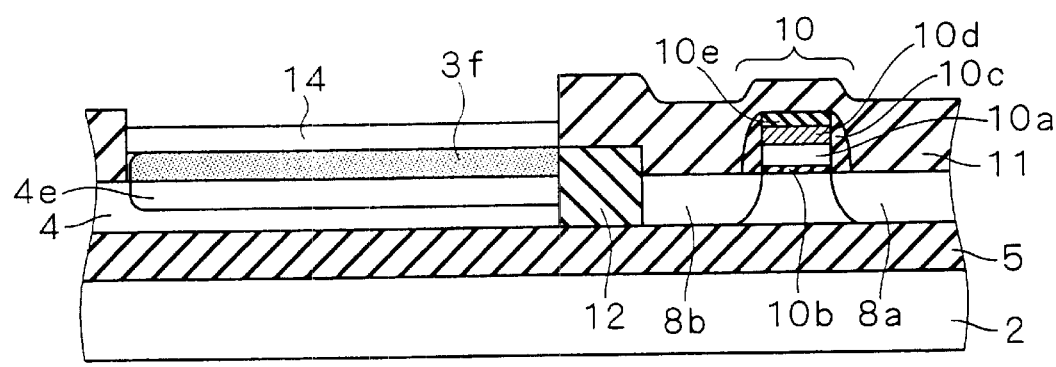

Impurity ions are implanted into the silicon single-crystalline layer 14 for injecting carriers (FIG. 23). In case of forming an NPN type, for example, N-type impurity ions of a high concentration are implanted into the silicon single-crystalline layer 14. In case of a PNP type, the characteristics of the impurity ions may be reversed.

Figure 24:
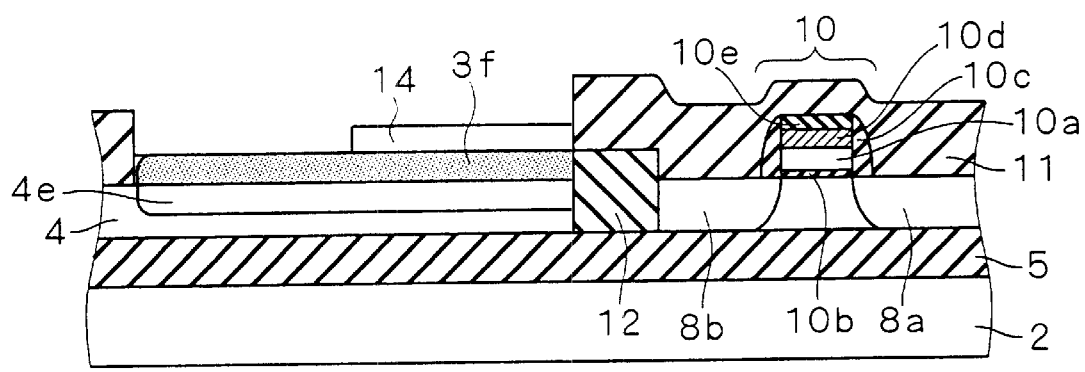
Figure 25:
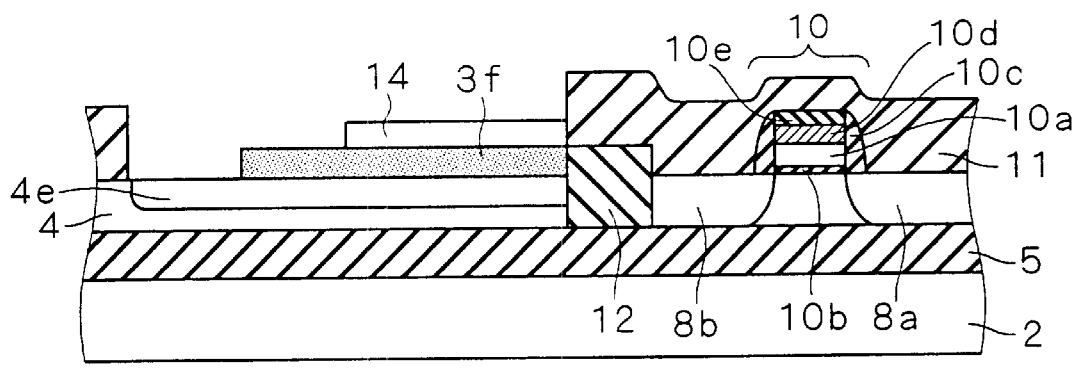
Figure 26:
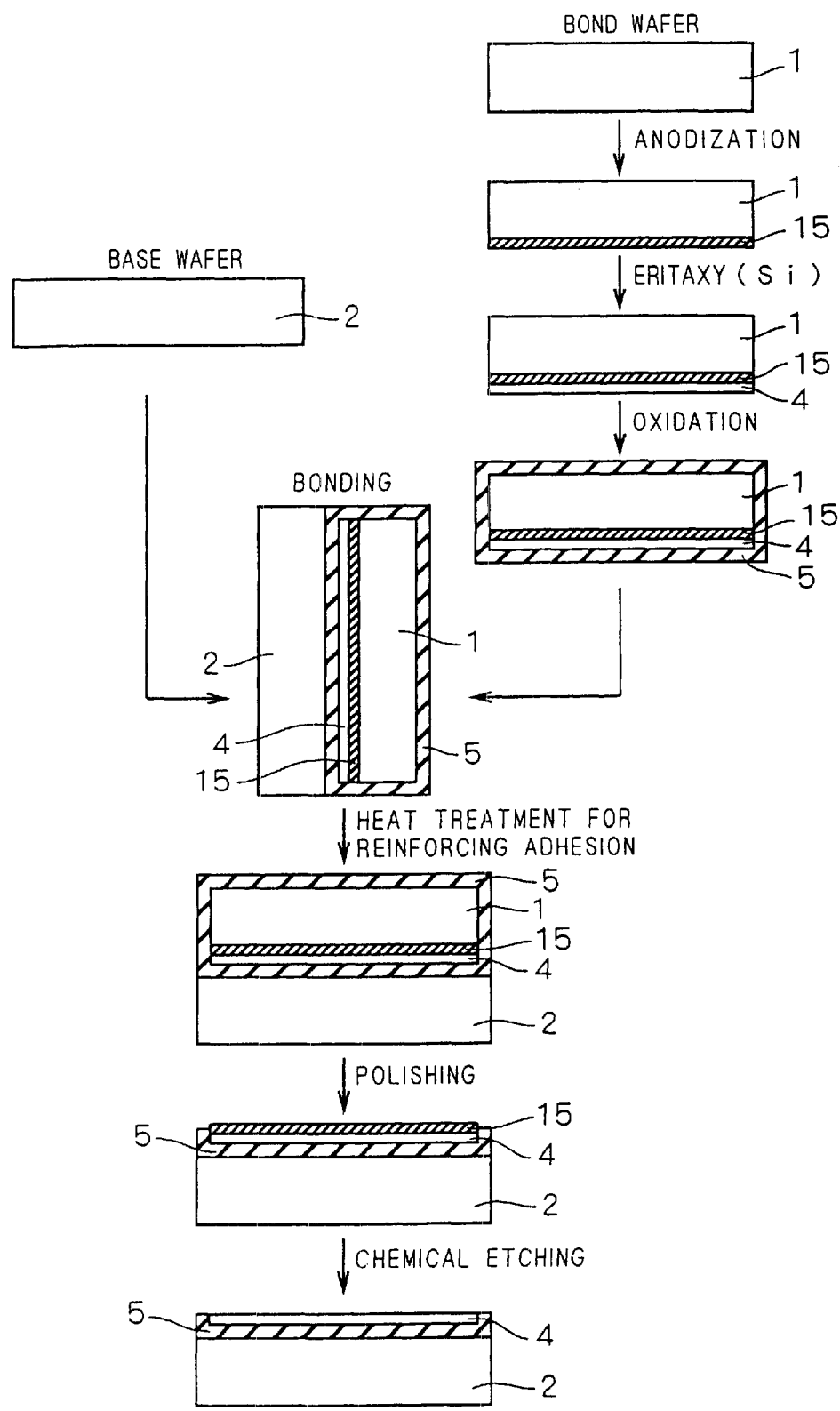
FIG. 26 illustrates sectional views showing steps of a conventional method of manufacturing an SOI substrate.

The silicon single-crystalline layer 14 is partially removed by etching (FIG. 24), and the silicon germanium single-crystalline layer 3f is also partially removed by etching for exposing the diffusion region 4e subjected to carrier injection (FIG. 25).

Thereafter another interlayer isolation film is further formed on the overall surface and flattened, and thereafter contact holes are formed and filled up with a wire material for forming the wires 9a to 9e.

In the method of manufacturing an SOI substrate according to this embodiment, the crystal state of the silicon germanium single-crystalline layer 3 is so excellent that a heterojunction bipolar transistor having excellent breakdown voltage can be manufactured. Further, the mobility of holes in the silicon germanium single-crystalline layer 3 is higher than that in silicon and hence the operating speed of a PNP heterojunction bipolar transistor can be increased. In addition, the silicon single-crystalline layer 4 is employed as a channel of the N-channel MOSFET 106, and hence the operating speed of the N-channel MOSFET 106 is higher than that in the case of employing the silicon germanium single-crystalline layer 3 as the channel.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising an SOI substrate manufactured by an SOI substrate manufacturing method comprising steps of (a) to (f), (h), (k) and (i):
   (a) forming a silicon-germanium single-crystalline layer on a main surface of a bond wafer comprising a single crystal of silicon;
   (b) forming a silicon single-crystalline layer on a surface of said silicon-germanium single-crystalline layer;
   (c) oxidizing a surface of said silicon single-crystalline layer;
   (d) bonding a base wafer comprising a single crystal of silicon to the oxidized surface of said silicon single-crystalline layer;
   (e) heating said bond wafer and said base wafer for reinforcing the degree of adhesion therebetween; and
   (f) removing said bond wafer,
   (h) forming a mask layer on said silicon-germanium single-crystalline layer after said step (f),
   (k) patterning said mask layer through photolithography, and
   (i) removing a part of said silicon-germanium single-crystalline layer not covered with said mask layer by employing patterned said mask layer as a mask,
       wherein said silicon germanium single-crystalline layer of said SOI substrate corresponds to a device forming layer.

2. The semiconductor device according to claim 1 further comprising a MOSFET including a channel and a source/drain region, wherein
   said device forming layer is employed as said channel and said source/drain region of said MOSFET.

3. The semiconductor device according to claim 2, wherein
   a part of said silicon single-crystalline layer exposed by removal of said silicon germanium single-crystalline layer is employed as said channel and said source/drain region as to a MOSFET wherein said channel is an N-channel.

4. The semiconductor device according to claim 1 further comprising an infrared detector including an infrared detection part, wherein
   said device forming layer is employed as said infrared detection part of said infrared detector.

5. The semiconductor device according to claim 1 further comprising:
- a silicon single-crystalline layer further formed on the upper surface of said silicon germanium single-crystalline layer; and
- a heterojunction bipolar transistor including a base layer, a collector layer and an emitter layer, wherein
- said device forming layer is said base layer of said heterojunction bipolar transistor, and
- one of said silicon single-crystalline layer formed on the upper surface of said silicon germanium single-crystalline layer and said silicon single-crystalline layer present on the lower surface of said silicon germanium single-crystalline layer is said collector layer of said heterojunction bipolar transistor, and the other is said emitter layer of said heterojunction bipolar transistor.

6. A semiconductor device comprising an SOI substrate manufactured by an SOI substrate manufacturing method comprising steps (a) to (c) of:
- (a) forming a mask layer on a surface of an SOI substrate comprising a base wafer consisting of a single crystal of silicon, a silicon oxide film formed on a surface of the said base wafer, a silicon single-crystalline layer formed on a surface of said silicon oxide film and a silicon germanium single-crystalline layer formed on a surface of said silicon single-crystalline layer;
- (b) patterning said mask layer through photolithography; and
- (c) removing a part of said silicon germanium single-crystalline layer not covered with said mask layer by employing patterned said mask layer as a mask,
  - wherein said silicon germanium single-crystalline layer of said SOI substrate corresponds to a device forming layer.

7. The semiconductor device according to claim 6 further comprising a MOSFET including a channel and a source/drain region, wherein
- said device forming layer is employed as said channel and said source/drain region of said MOSFET.

8. The semiconductor device according to claim 7, wherein
- a part of said silicon single-crystalline layer exposed by removal of said silicon germanium single-crystalline layer is employed as said channel and said source/drain region as to a MOSFET wherein said channel is an N-channel.

9. The semiconductor device according to claim 6 further comprising an infrared detector including an infrared detection part, wherein
- said device forming layer is employed as said infrared detection part of said infrared detector.

10. The semiconductor device according to claim 6 further comprising:
- a silicon single-crystalline layer further formed on the upper surface of said silicon germanium single-crystalline layer; and
- a heterojunction bipolar transistor including a base layer, a collector layer and an emitter layer, wherein
- said device forming layer is said base layer of said heterojunction bipolar transistor, and
- one of said silicon single-crystalline layer formed on the upper surface of said silicon germanium single-crystalline layer and said silicon single-crystalline layer present on the lower surface of said silicon germanium single-crystalline layer is said collector layer of said heterojunction bipolar transistor, and the other is said emitter layer of said heterojunction bipolar transistor.

* * * * *